(12) United States Patent
Kane

(10) Patent No.: US 7,492,600 B2
(45) Date of Patent: Feb. 17, 2009

(54) SEALED HEADER AND METHOD OF MAKING

(75) Inventor: Vincent M Kane, Harrisburg, PA (US)

(73) Assignee: Tyco Electronics Corporation, Middletown, PA (US)

( * ) Notice: Subject to any disclaimer, the term of this patent is extended or adjusted under 35 U.S.C. 154(b) by 822 days.

(21) Appl. No.: 10/713,608

(22) Filed: Nov. 14, 2003

(65) Prior Publication Data

US 2005/0122694 A1    Jun. 9, 2005

(51) Int. Cl.
 *H05K 5/00*    (2006.01)
(52) U.S. Cl. .................................. 361/752; 361/800
(58) Field of Classification Search ............. 361/752, 361/796, 728, 736; 174/50; 439/751, 82, 439/744, 746, 76.1; 312/223
See application file for complete search history.

(56) References Cited

U.S. PATENT DOCUMENTS

| | | | | |
|---|---|---|---|---|
| 5,181,855 | A * | 1/1993 | Mosquera et al. | 439/74 |
| 5,340,334 | A * | 8/1994 | Nguyen | 439/620.12 |
| 5,998,738 | A | 12/1999 | Li et al. | 174/250 |
| 6,139,373 | A * | 10/2000 | Ward et al. | 439/733.1 |
| 6,606,252 | B1 * | 8/2003 | Snider | 361/777 |
| 6,616,480 | B2 * | 9/2003 | Kameyama | 439/587 |
| 6,652,292 | B2 * | 11/2003 | Pratt et al. | 439/76.1 |
| 6,683,789 | B1 | 1/2004 | Sheynis et al. | 361/752 |
| 7,125,285 | B2 * | 10/2006 | Maejima et al. | 439/607 |
| 7,210,969 | B1 * | 5/2007 | Hashimoto et al. | 439/751 |
| 2003/0049972 | A1 * | 3/2003 | Aoki | 439/751 |
| 2003/0161110 | A1 * | 8/2003 | Spasevski et al. | 361/715 |

* cited by examiner

Primary Examiner—Hung S Bui

(57) ABSTRACT

An electronic module (2) comprises casing 4, and header 6 with a printed circuit board 10 positioned within a cavity 26 of casing 4. Connector 6 includes terminals 8, which allow for electrical connection for a mating connector, but also include compliant portions 54 which form the mechanical and electrical connector to printed circuit board 10. Compliant portions 54 together with an adhesive 62 provide for the bonded connection between header 6 and printed circuit board 10. Gasket 60 further provides a peripheral seal between casing 4 and header 6.

26 Claims, 18 Drawing Sheets

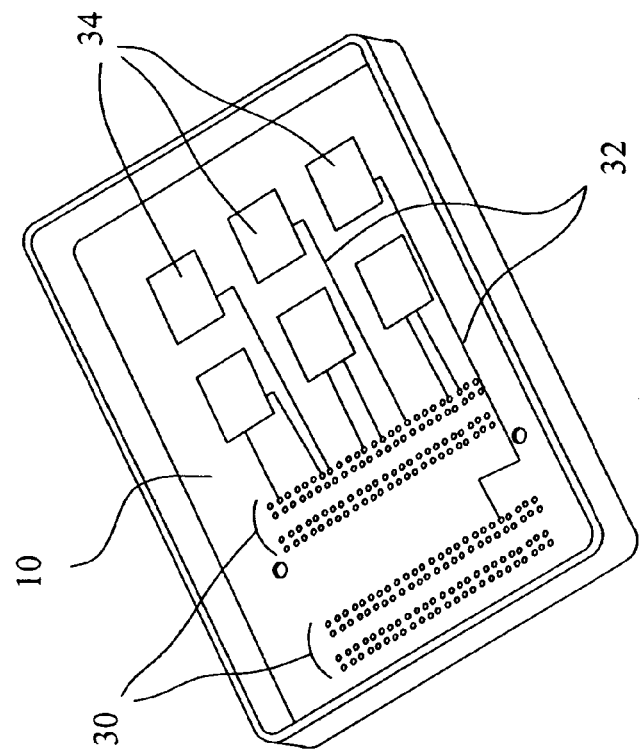
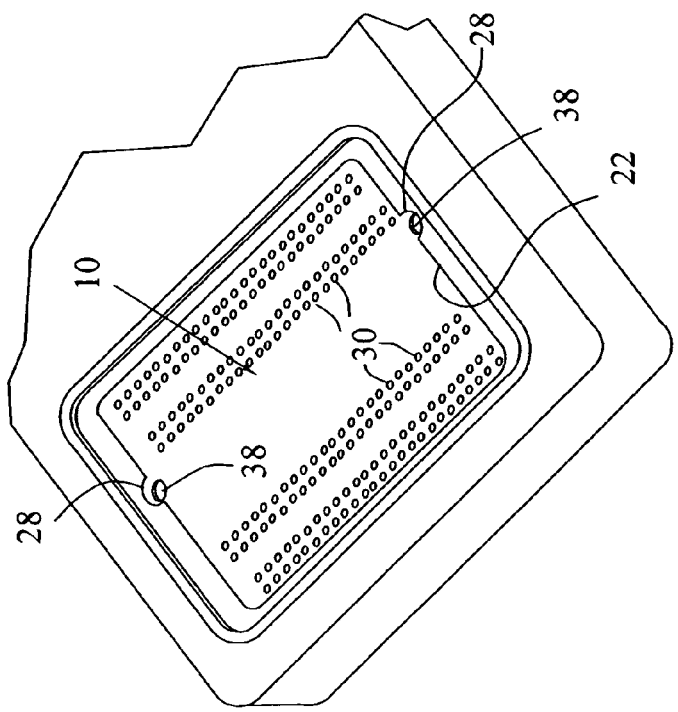

SEALED HEADER AND METHOD OF MAKING

FIELD OF THE INVENTION

The invention relates to an electronic control module and a method for making the same.

BACKGROUND OF THE INVENTION

It is quite common in the automotive industry to provide sealed electronic control modules. Such modules are useful for controlling any of the engine functions, such as air fuel ratio, ignition, fuel injection, and the like. Typically, the modules include a housing or casing having a substrate therein, positioned therein, where the substrate includes electronic components to control the various functions. The substrate could comprise a printed circuit board or flexible substrate. The substrate would include a connection mechanism adjacent to an edge thereof, where the connector is positioned adjacent an opening of the casing. The casing would thereafter be positionable adjacent to the engine, where the connector on the control module would complement a connector on the engine device to be monitored/controlled.

Such is the case in U.S. Pat. No. 5,998,738, where a flexible film substrate is provided having a plurality of electronic components including chips, diodes, etc. An electrical connector has contacts which extend through a base plate and into contact with throughholes on the flexible film. The base plate and flexible film are thereafter folded back upon each other and positioned within a housing with the connector extending out a front edge thereof.

The module described in U.S. Pat. No. 5,998,738 is difficult to manufacture, and due to the fact that the flexible film is wrapped around the housing member, the design proves difficult to properly seal.

Thus, the object of the invention is to improve upon and eliminate the shortcomings of the prior art.

SUMMARY OF THE INVENTION

The objects of the invention have been accomplished by providing an electronic module, comprising a casing defining a cavity therein, the casing having an opening therethrough for communication with the cavity, a substrate received in the cavity, where the substrate has a plurality of throughholes positioned adjacent to and overlapping with the opening. A connector header is positioned over the casing opening, the connector having a plurality of electrical terminals, with first portions positioned exterior of the cavity, and second portions extending into the cavity and into the throughholes of the substrate forming an electrical and mechanical connection therewith. The mechanical connection retains the connector header and substrate to the casing.

The casing is defined by a planar wall and upstanding peripheral walls, the opening extending through the planar wall, and the peripheral walls forming the cavity. The terminal second portions are compliant pin sections. The substrate is a printed circuit board, and the throughholes are plated and interconnected to traces on the circuit board. The printed circuit board includes components positioned within the cavity and mounted to the printed circuit board, interconnected to the traces. The casing further comprises an upstanding sealing wall in a surrounding relation to the opening. The connector header has a sealing groove with a complementary geometry as the upstanding sealing wall and is received therein. The electronic further comprises a seal member positioned within the sealing groove and in sealing contact with the sealing wall. The connector header has a mounting surface which extends at least partially into the opening and contacts the substrate. The header mounting surface is adhesively fixed to the substrate.

In an inventive method, a method of making an electronic module comprises the steps of providing a casing defining a cavity therein, the casing having an opening therethrough for communication with the cavity; positioning a substrate in the cavity, the substrate having a plurality of throughholes positioned adjacent to and overlapping with the opening; positioning a connector header over the casing opening in a mating direction, the connector having a plurality of electrical terminals, with first portions positioned exterior of the cavity, and second portions extending into the cavity and into the throughholes of the substrate forming an electrical and mechanical connection therewith; providing a sealing member between the casing and the header which is compressed in the mating direction, and retaining the connector header directly to the substrate.

The mechanical connection retains the connector header and substrate to the casing. The terminal second portions are provided as compliant pin sections. The casing is provided with an upstanding sealing wall in a surrounding relation to the opening. The connector header is provided with a sealing groove with a complementary geometry as the upstanding sealing wall and is received therein. The seal member is positioned within the sealing groove and in sealing contact with the sealing wall. The connector header is provided with a mounting surface which extends at least partially into the opening and is placed in contact with the substrate. The header mounting surface is adhesively fixed to the substrate. The connector header, casing and substrate are attached to each other simultaneously. The connector header, casing and substrate are attached to each other by a single movement towards each other along the mating axis.

BRIEF DESCRIPTION OF THE DRAWINGS

FIG. 3 is a view similar to that of FIG. 2 showing the printed circuit board received in the electrical header;

FIG. 4 is a view similar to that of FIG. 3 with a perspective of the opposite side;

DETAILED DESCRIPTION OF THE PREFERRED EMBODIMENT

Figure 1:
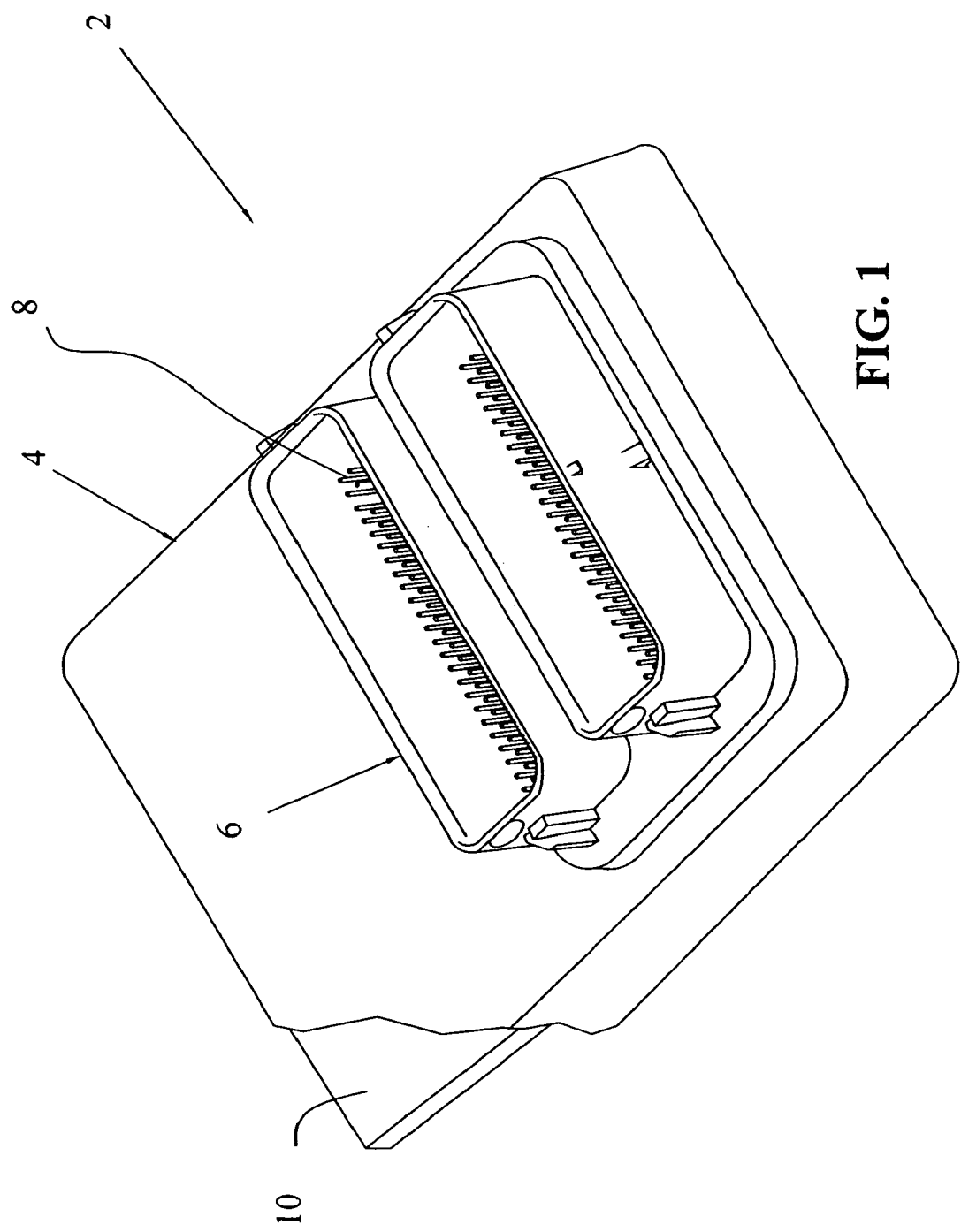
FIG. 1 is a perspective view of a first embodiment of the subject module assembly.

With respect first to FIG. 1, an electronic module is shown at 2, which is generally comprised of a casing 4, an electrical connector header 6 having electrical terminals 8, which are then interconnected to printed circuit board 10. It should also be appreciated that the printed circuit board 10 is confined within the cavity of the casing 4 and can be sealed by various methods as described herein. It would also be appreciated that the casing would be comprised of a material suitable for use in an engine compartment, such as a cast metal material, for example, cast aluminum.

Figure 2:
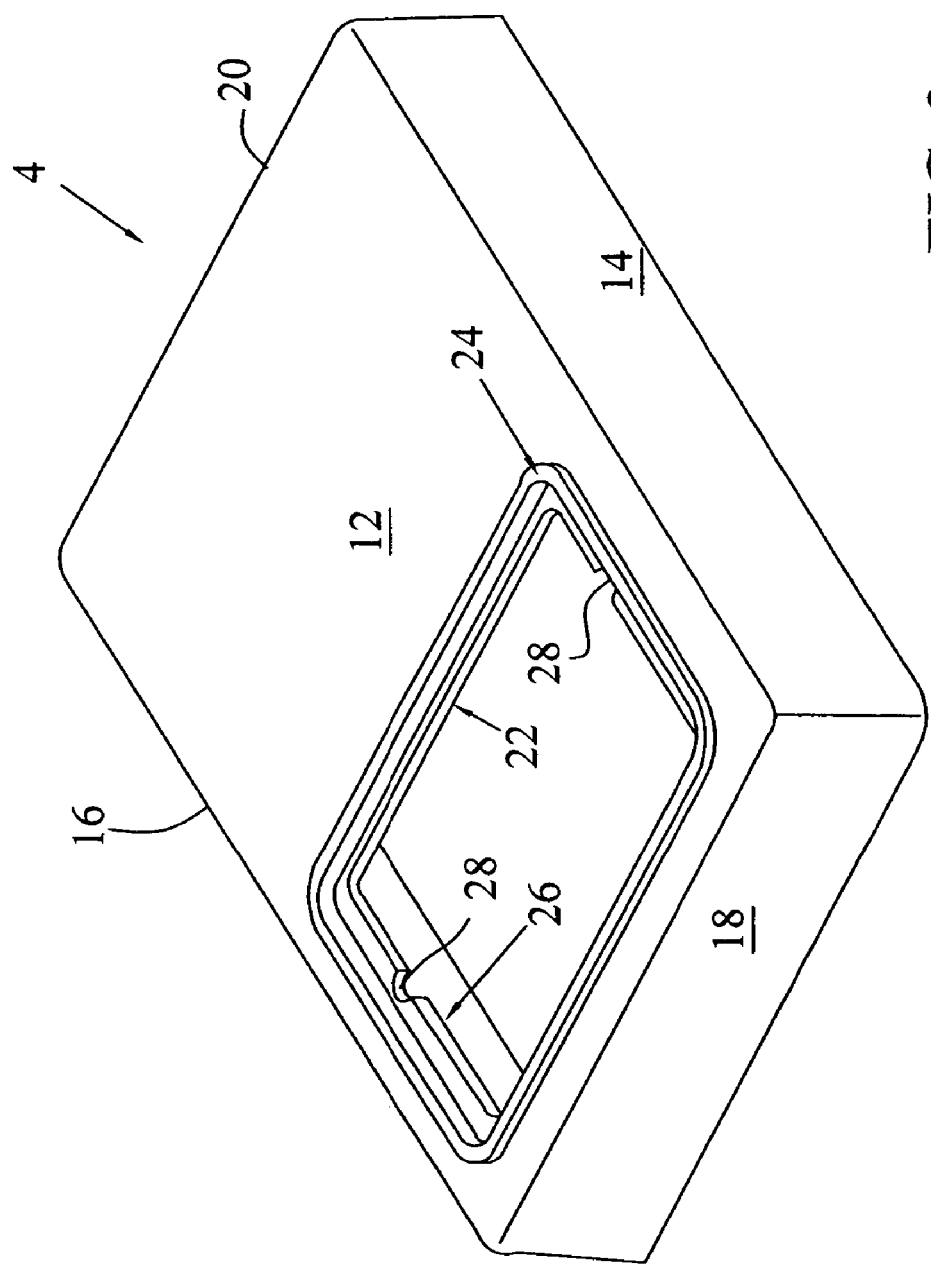
FIG. 2 is a perspective view of the casing of the module shown in FIG. 1.

With reference now to FIG. 2, the casing 4 will be described in greater detail. Casing 4 is generally defined by a rectangular-shaped member having a major planar surface at 12, side walls 14 and 16, and end walls 18, 20. As also shown in FIG. 2, an opening 22 is defined through surface 12 and is bounded by a peripheral sealing wall 24. It should also be appreciated that the volume within casing 4 bounded by walls 12-20 generally defines an internal cavity at 26. Finally, semi-circular apertures 28 are positioned adjacent to the edge of opening 22, as will be described herein. Casing 4 is preferable comprised of a metal such as aluminum.

With reference now to FIGS. 3 and 4, printed circuit board 10 will be described in greater detail. With respect first to FIG. 4, printed circuit board 10 has a rectangular configuration similarly shaped to that of the area of cavity 26 and includes a plurality of rows of throughholes at 30, which as shown in FIG. 3 are accessible through opening 22. It should also be appreciated that throughholes 30 are interconnected to traces, such as 32, which are thereafter interconnected to electronic devices 34, which could be any device for electronic control. Finally, with respect to FIG. 3, printed circuit board 10 includes apertures 38, which align with semicircular apertures 28, as will be described herein.

Figure 5:
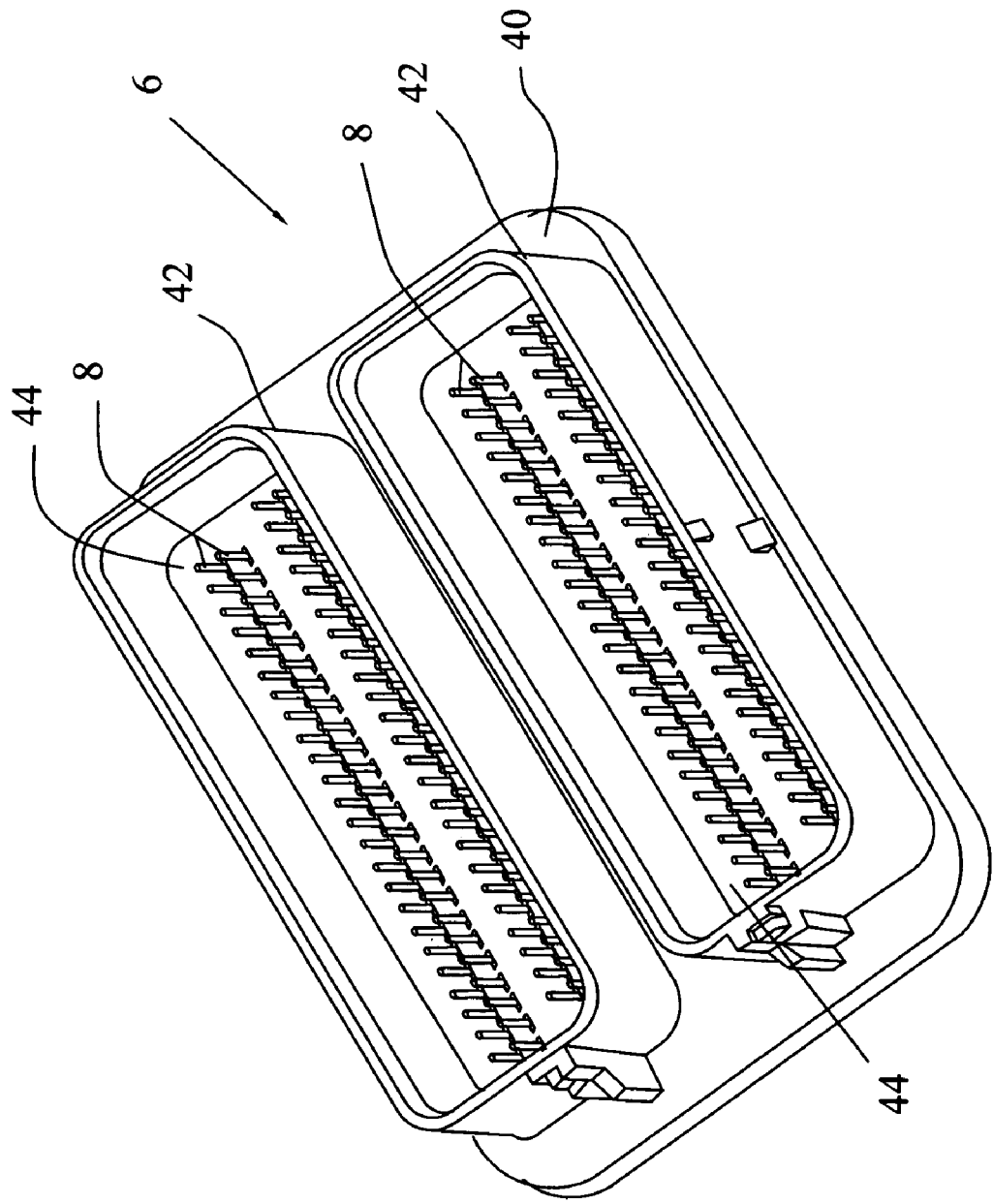
FIG. 5 is a perspective view of the electrical header connector shown in FIG. 1.
Figure 6:
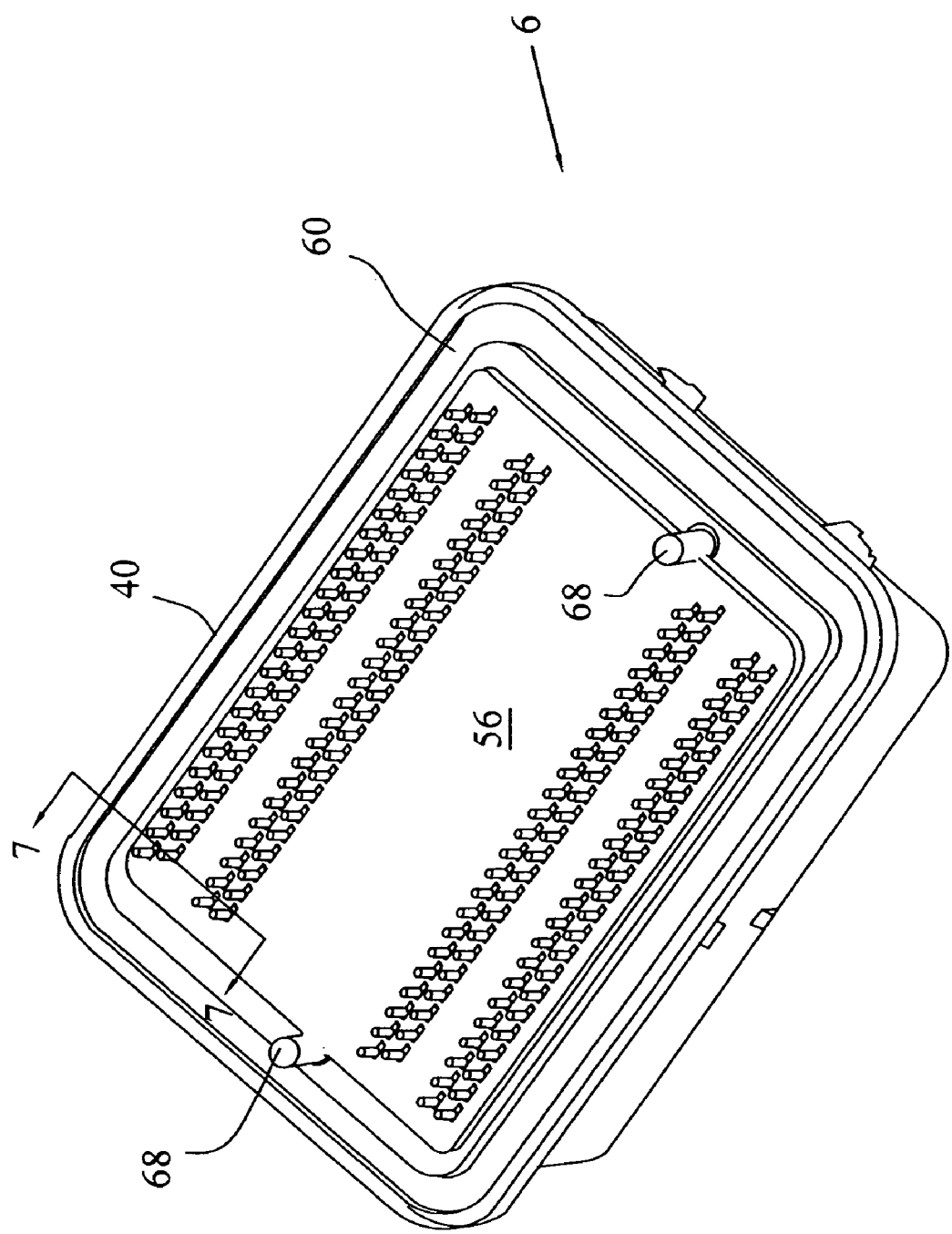
FIG. 6 is a reverse perspective of that of FIG. 5.
Figure 7:
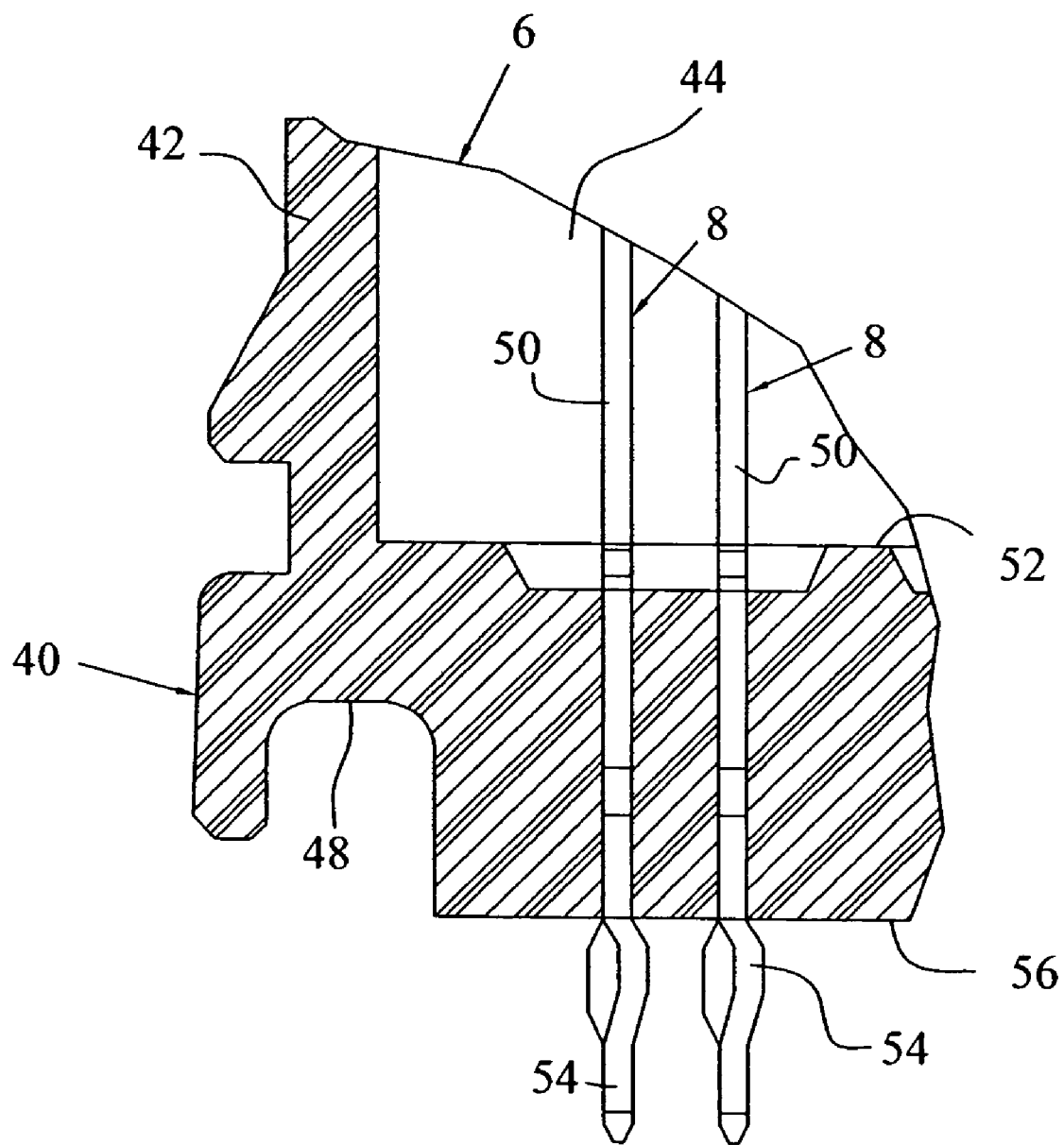
FIG. 7 is a cross-sectional view through lines 7-7 of FIG. 6.

With reference now to FIG. 5, the electrical header 6 generally comprises a base portion 40 having shrouds 42 upstanding therefrom, which define internal cavities 44 for protecting terminals 8. With respect now to FIGS. 6 and 7, base portion 40 includes a peripheral channel 48 (FIG. 7) which runs around the periphery of the base and is generally configured as the upstanding sealing wall 24, as will be described in further detail. Furthermore, terminals 8 include pin portions 50, which extend upwardly from internal surface 52, and have compliant pin portions 54, which extend downwardly from a lower surface 56. Compliant pin portions 54 are known as assignee's ACTION PIN® terminals. As shown in FIG. 6, a gasket seal 60 is positioned in channel 48 and is a compressible seal. The seal is cured in place in the channel and is made from silicone. However, a discrete seal could also be used made from a neoprene rubber, foam rubber or any suitable type sealing material. Furthermore, a pressure-sensitive adhesive material 62 is positioned on the bottom of surface 56 (FIG. 9) for mounting of the connector header 6, as will be described further herein. Finally, aligning posts 68 upstand from surface 56 for aligning purposes, also to be described herein.

Figure 8:
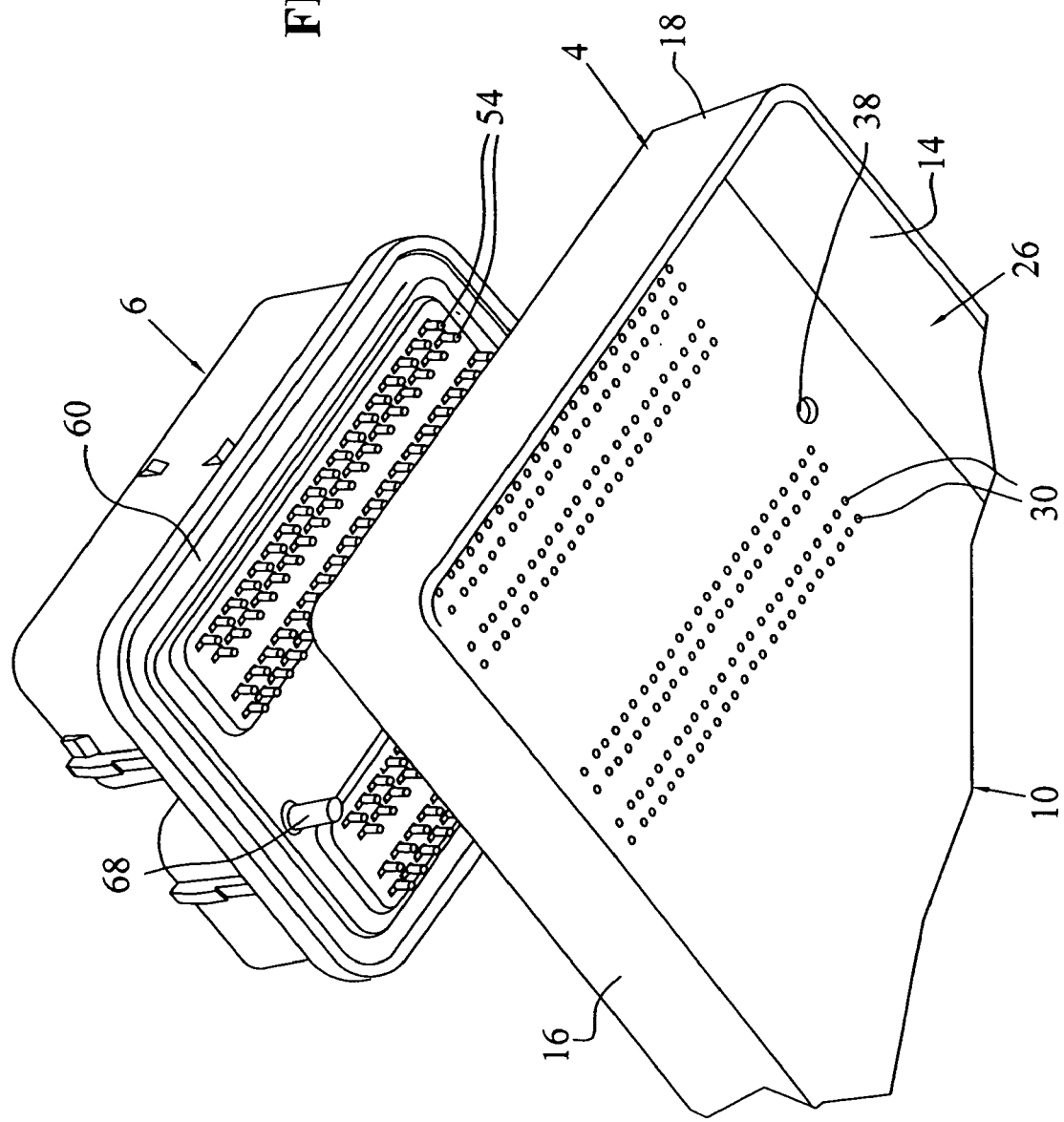
FIG. 8 is a perspective view showing the header poised for receipt on the casing and into electrical connection with the printed circuit board.

With the components as described above, the assembly of the components will now be described. With respect to FIG. 8, printed circuit board 10 is shown positioned within cavity 26 of casing 4 with throughholes 30 configured as shown in FIG. 3. Header connector 6 is also shown with a plurality of compliant pin portions 54 shown poised for receipt within the throughholes 30. It should be appreciated that the combination of elements is profiled such that, when posts 68 are aligned with the counterpart apertures 28, 38 (FIG. 3), compliant pin portions 54 match their counterpart throughholes 30 and seal 60 and cavity 48 match peripheral seal wall 24. It should be appreciated that a pushing force on connector header 6, with backup pressure on printed circuit board 10, allows compliant pin portions 54 to be mechanically and electrically connected to throughholes 30.

The pressure applied between printed circuit board 10 and header 6 will cause adhesive seal 62 to bond to the top surface of printed circuit board 10 and therefore hold the three components; headers 6, casing 4 and printed circuit board 10, together, with the casing 4 sandwiched there between. This is also best shown in FIGS. 9 and 10, where seal 60 is compressed within cavity 48 and against sealing wall 24. Adhesive 62 is also shown bonded between printed circuit board 10 and lower surface 56 of connector header 6. Compliant pin portions 54 are also shown within respective apertures 30.

Figure 9:
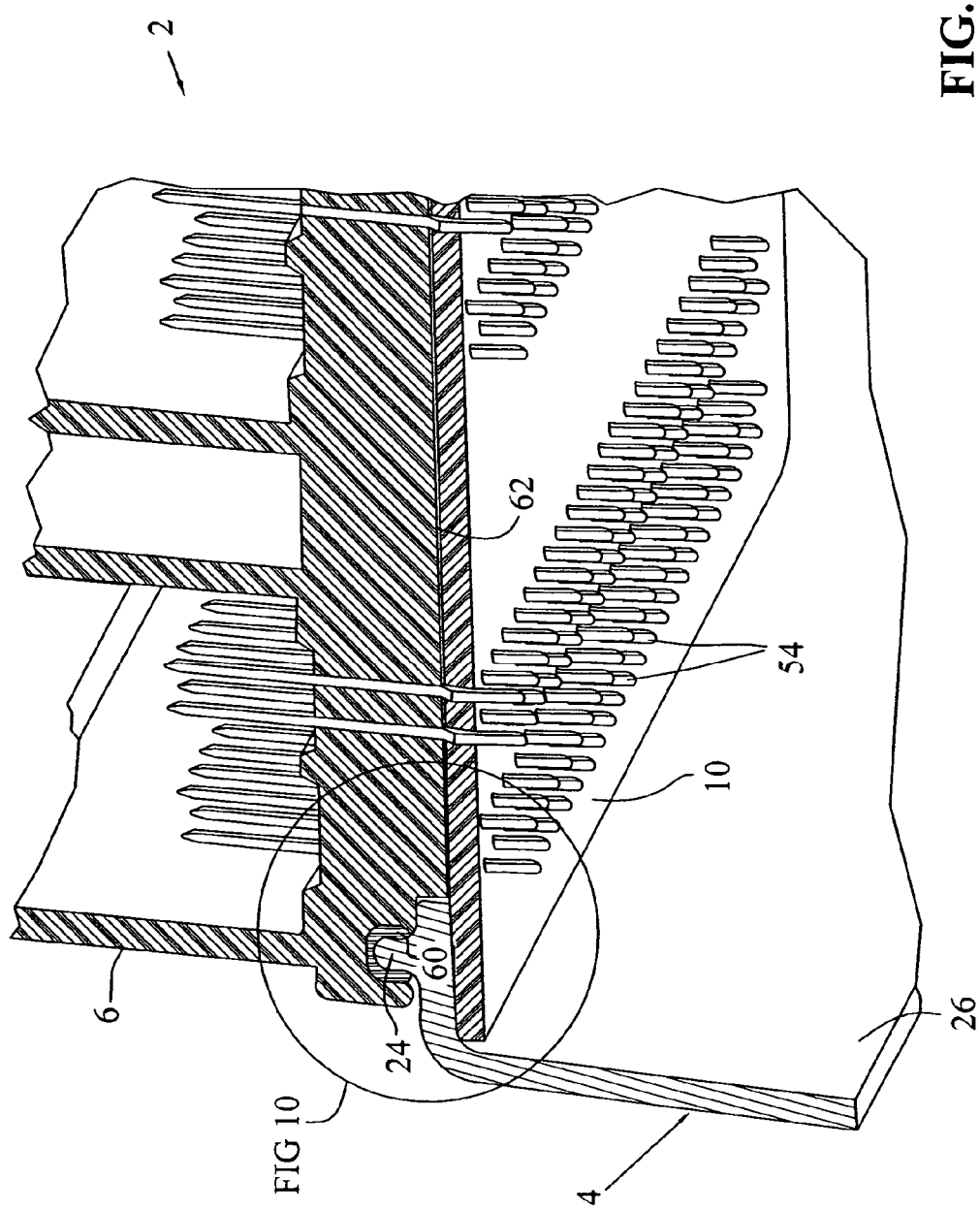
FIG. 9 is a cross-sectional view of the completed assembly.
Figure 10:
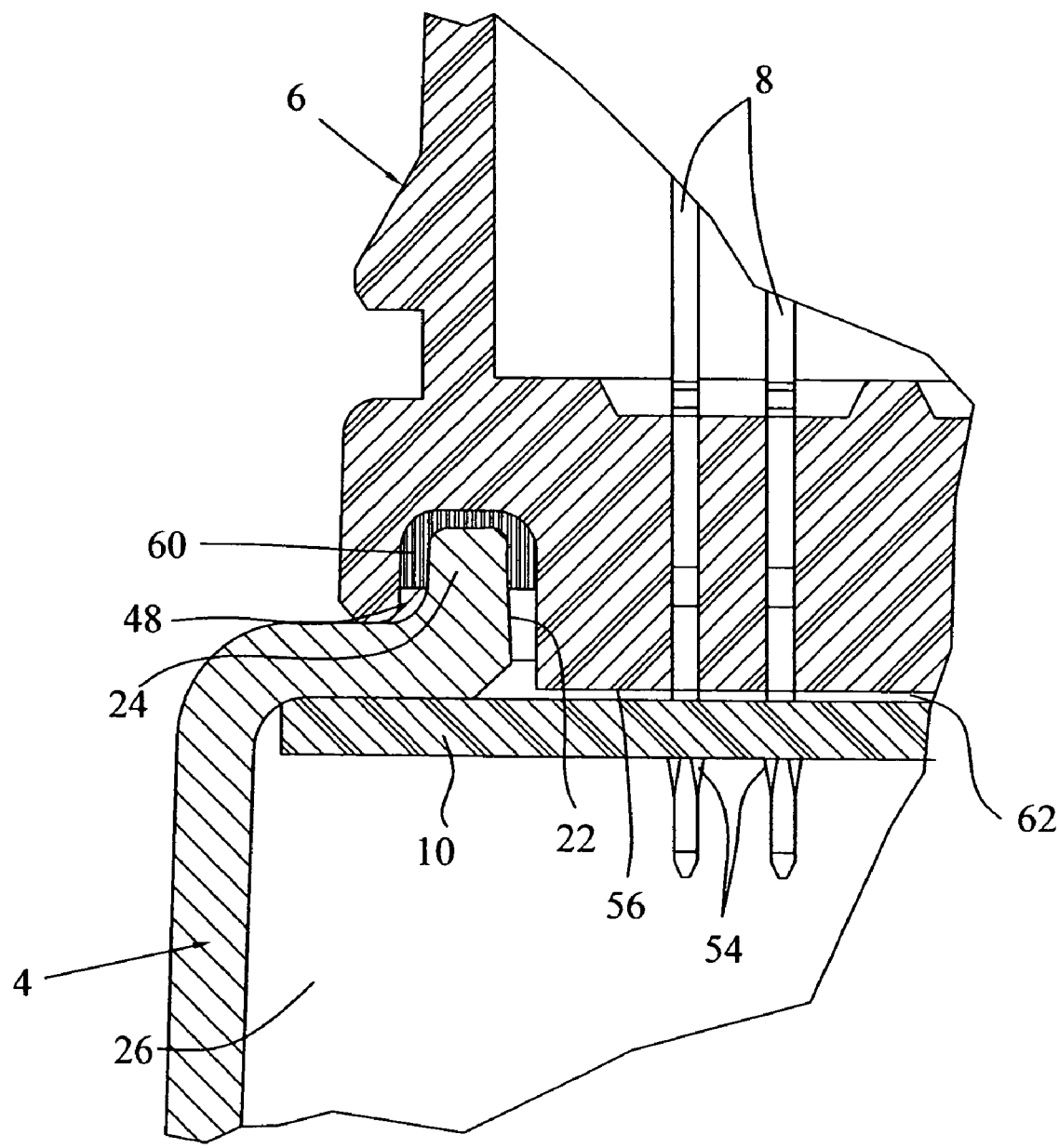
FIG. 10 shows an enlarged view of the area designated in FIG. 9.
Figure 11:
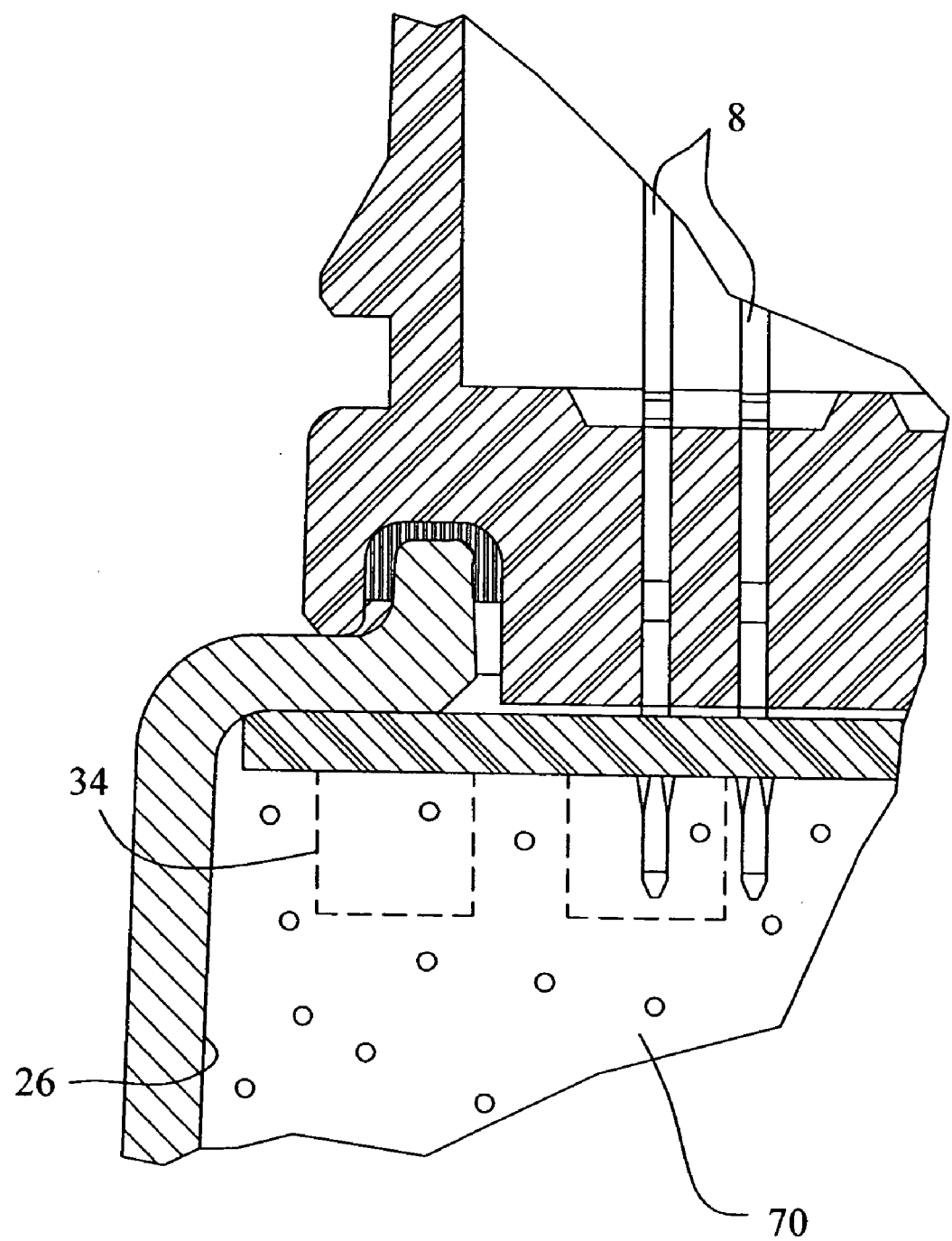
FIG. 11 is a cross-section view similar to that of FIG. 10 showing the electrical components sealed by a potting material.
Figure 12:
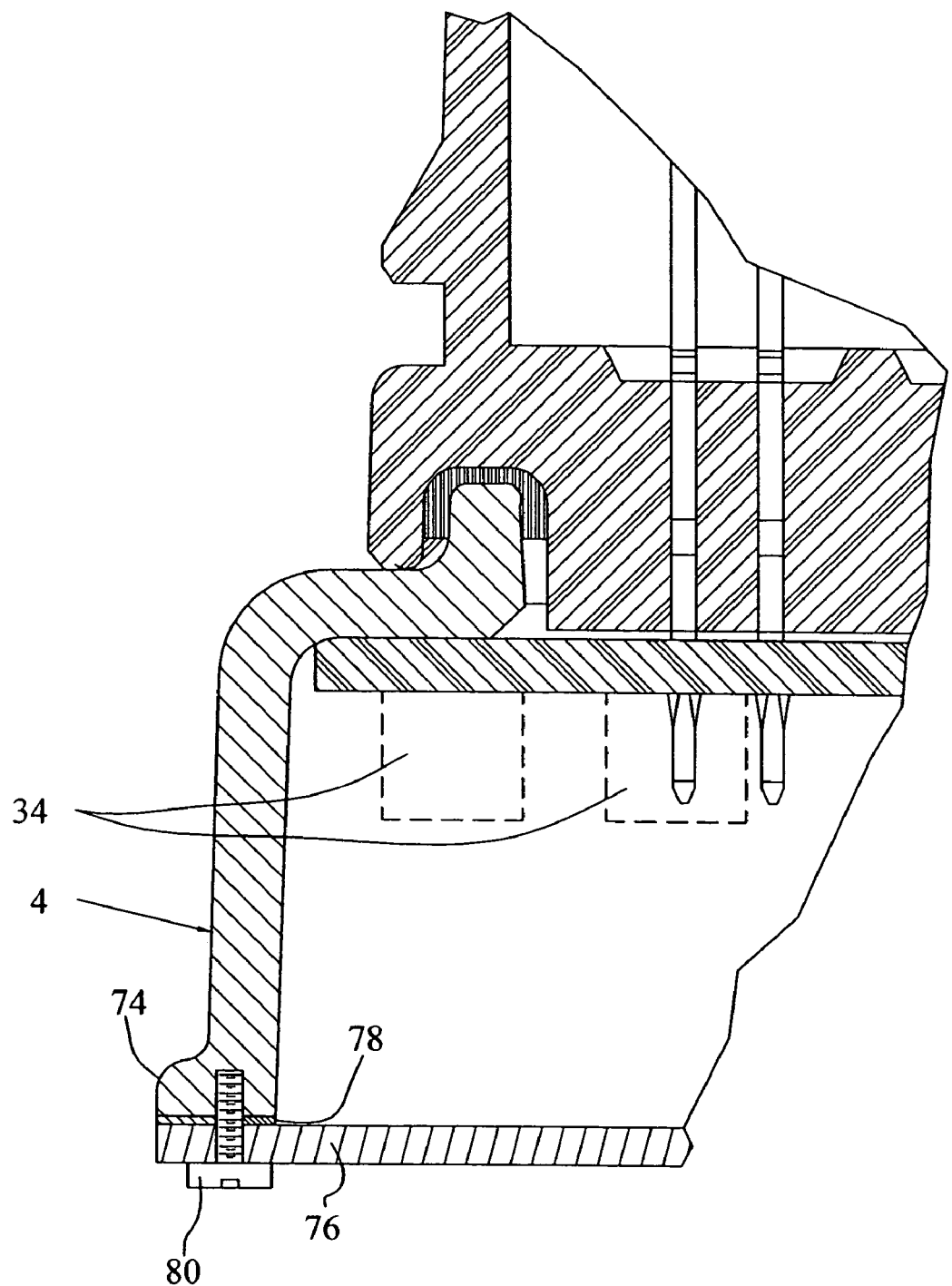
FIG. 12 shows a view similar to that of FIG. 11 including a sealing cover.

After assembling the casing 4, printed circuit board 10 and header 6 into the configuration shown in FIG. 9, cavity 26 can be sealed in a variety of ways. Firstly, as shown in FIG. 11, a potting material 70 can be placed within cavity 26 to seal terminals 8 and electronic devices 34. Alternatively, casing 4 could include mounting ears, such as 74 (FIG. 12), with a cover plate 76 and gasket 78 held thereto by way of a fastener, such as 80. It should also be appreciated that any type of adhesive or epoxy could be used for pressure adhesive 62.

With reference now to FIGS. 13 through 20, a second embodiment of the invention will be described. This embodiment is substantially similar to that of the embodiment shown in FIGS. 1 through 12 and therefore only the distinctions will be described in great detail.

Figure 13:
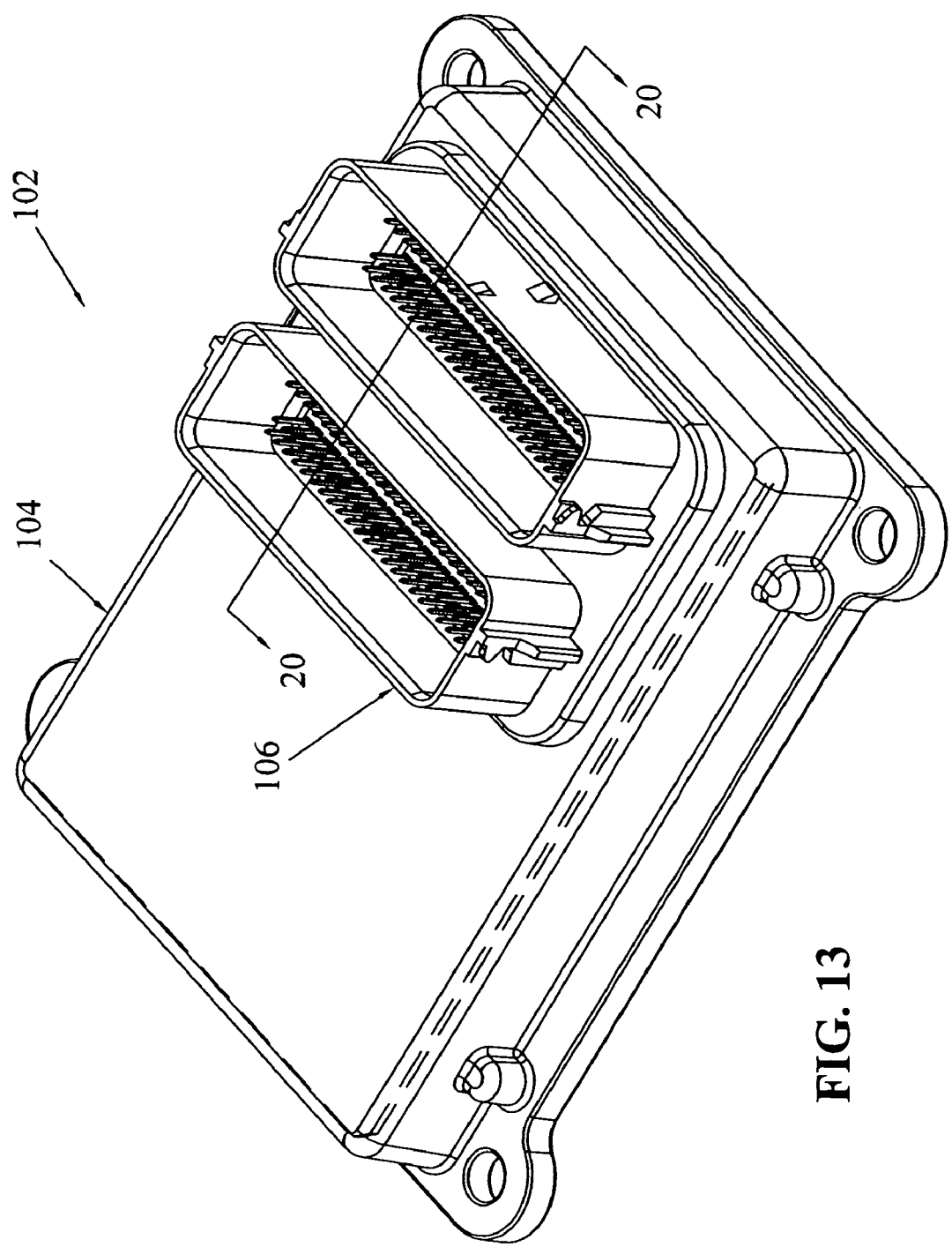
FIG. 13 is a second embodiment of the invention, and is a perspective view similar to that of FIG. 1.

As shown in FIG. 13, a second embodiment of the electronic module is shown at 102, having a casing 4 and an electrical connector header 6.

Figure 14:
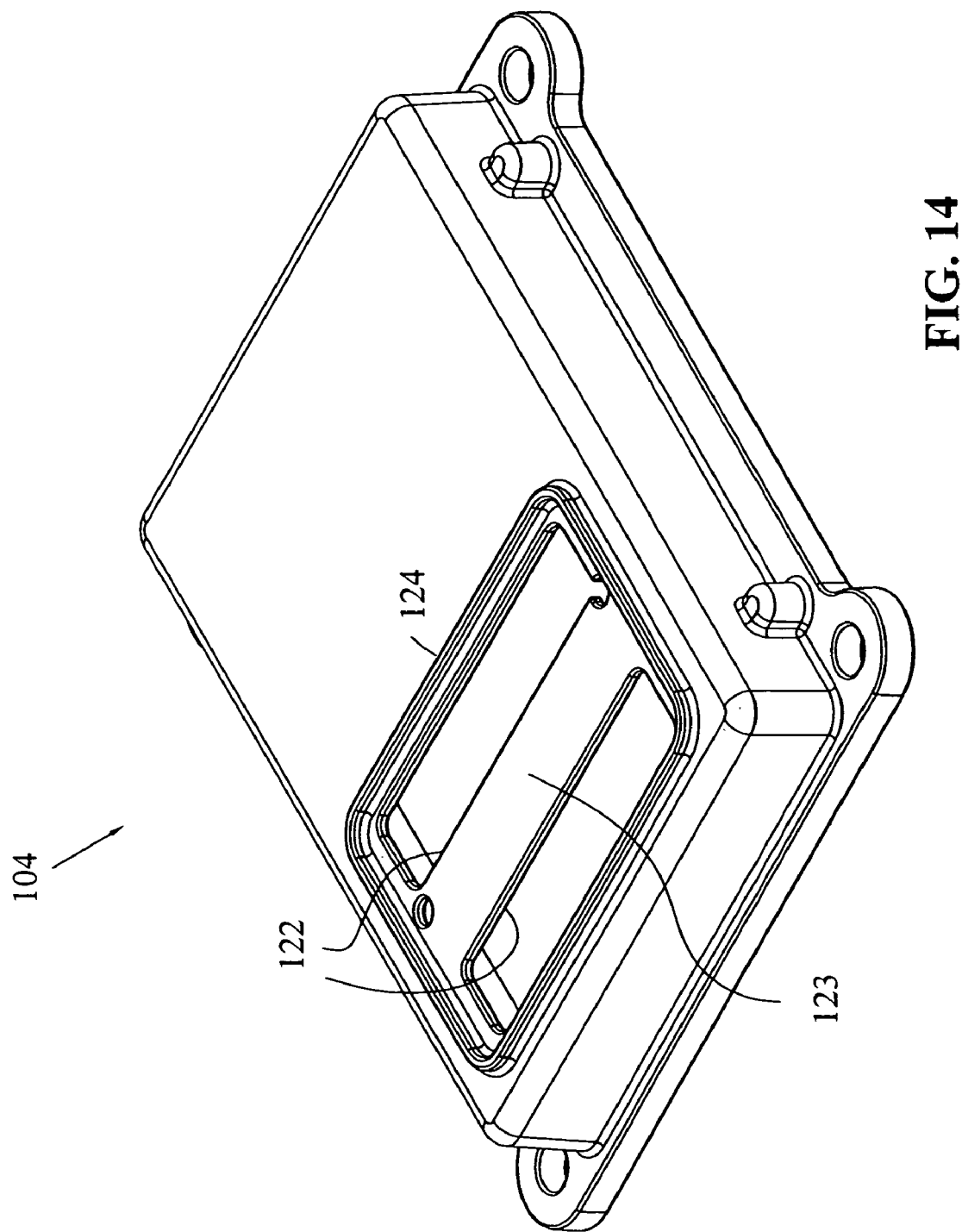
FIG. 14 is a view of the casing of the module shown in FIG. 13.
Figure 16:
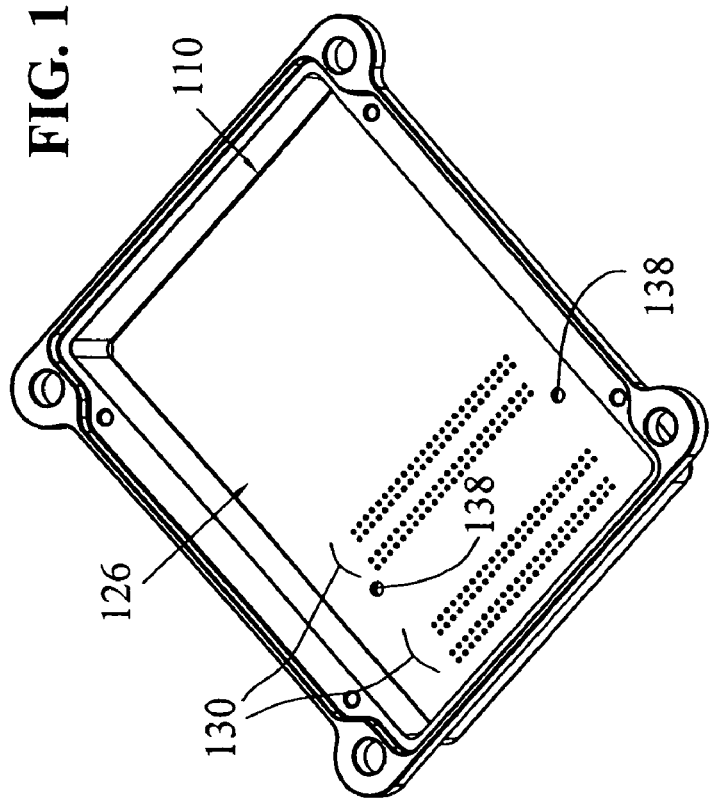
FIG. 16 is an underside view of the casing and printed circuit board shown in FIG. 15.
Figure 15:
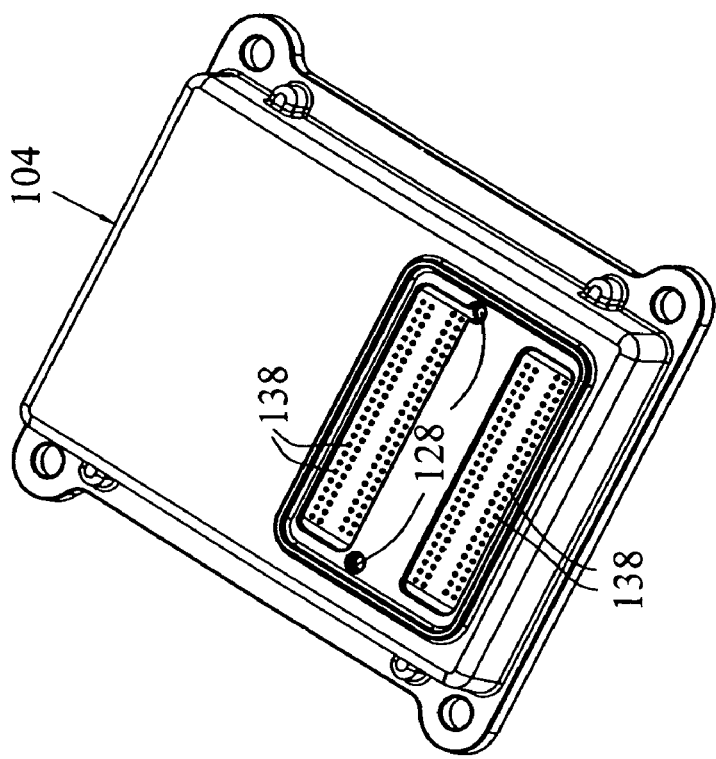
FIG. 15 is a view similar to that of FIG. 14 showing the printed circuit board in position within the casing of the module.

With reference to FIG. 14, the casing 104 has plural openings formed at 122 separated by an integrated strap portion 123 of the casing 104. The casing 104 also includes a peripheral sealing wall 124 surrounding the openings 122. As shown in FIGS. 15 and 16, a circuit board 110 can be positioned within a volume 126 of the casing, which positions printed circuit board throughholes 130 in position with openings 122 of the casing and aligns apertures 128, 138.

Figure 17:
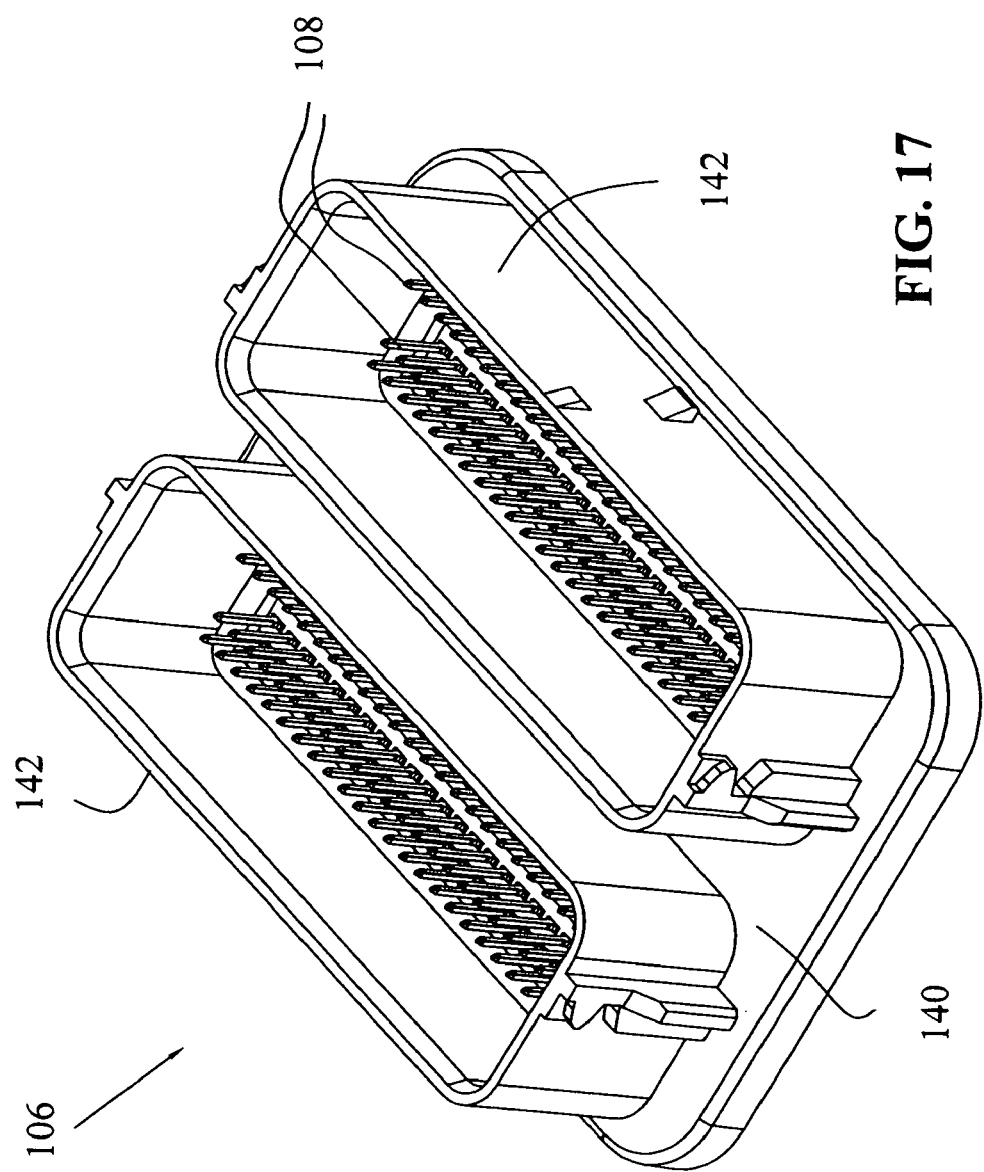
FIG. 17 is a perspective view of the electrical header connector shown in FIG. 13.
Figure 18:
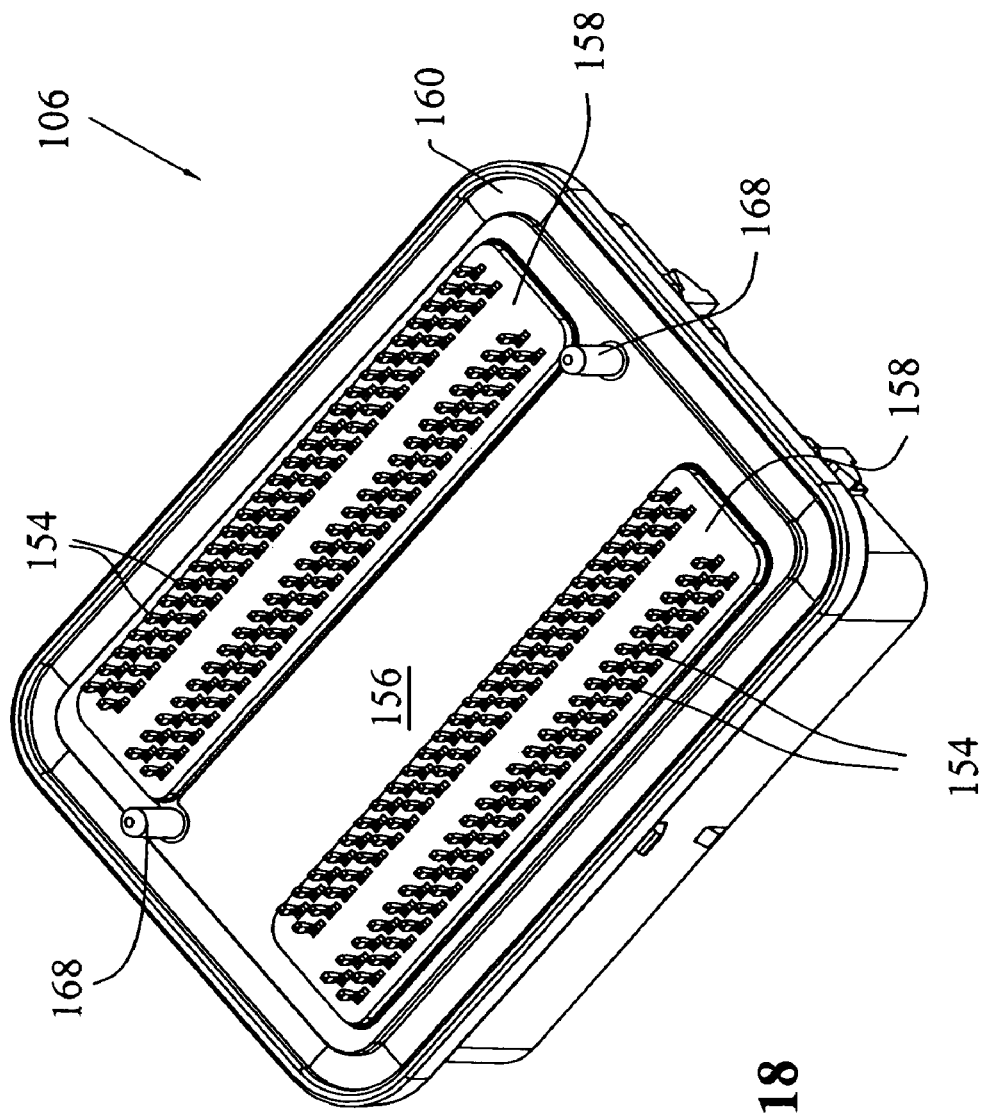
FIG. 18 is an underside perspective of that of FIG. 17.

With reference now to FIGS. 17 and 18, header 106 includes a base portion 140 having upstanding shrouds 142 in a surrounding relationship to the array of terminals 108. As shown in FIG. 18, the lower side of header 106 includes a lower surface 156 and raised surfaces 158 through which compliant pin portions 154 extend. It should be appreciated that raised portions 158 are profiled to be received through openings 122 of casing 104, as will be described herein. Header 106 also includes a gasket seal 160 and aligning posts 168, similar to that of the embodiment described with respect to FIGS. 1 through 12.

Figure 19:
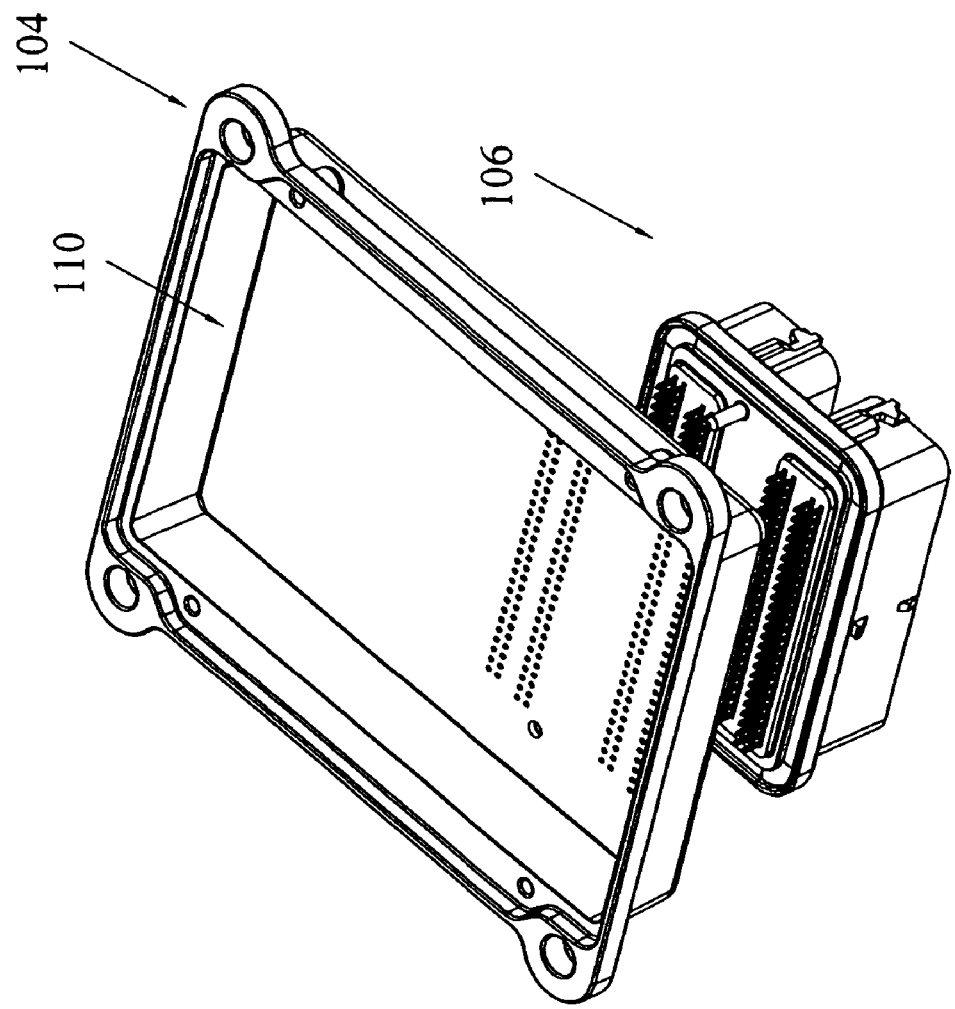
FIG. 19 is a perspective view showing the header of FIG. 18 poised for receipt on the casing and into electrical connection with the printed circuit board.
Figure 20:
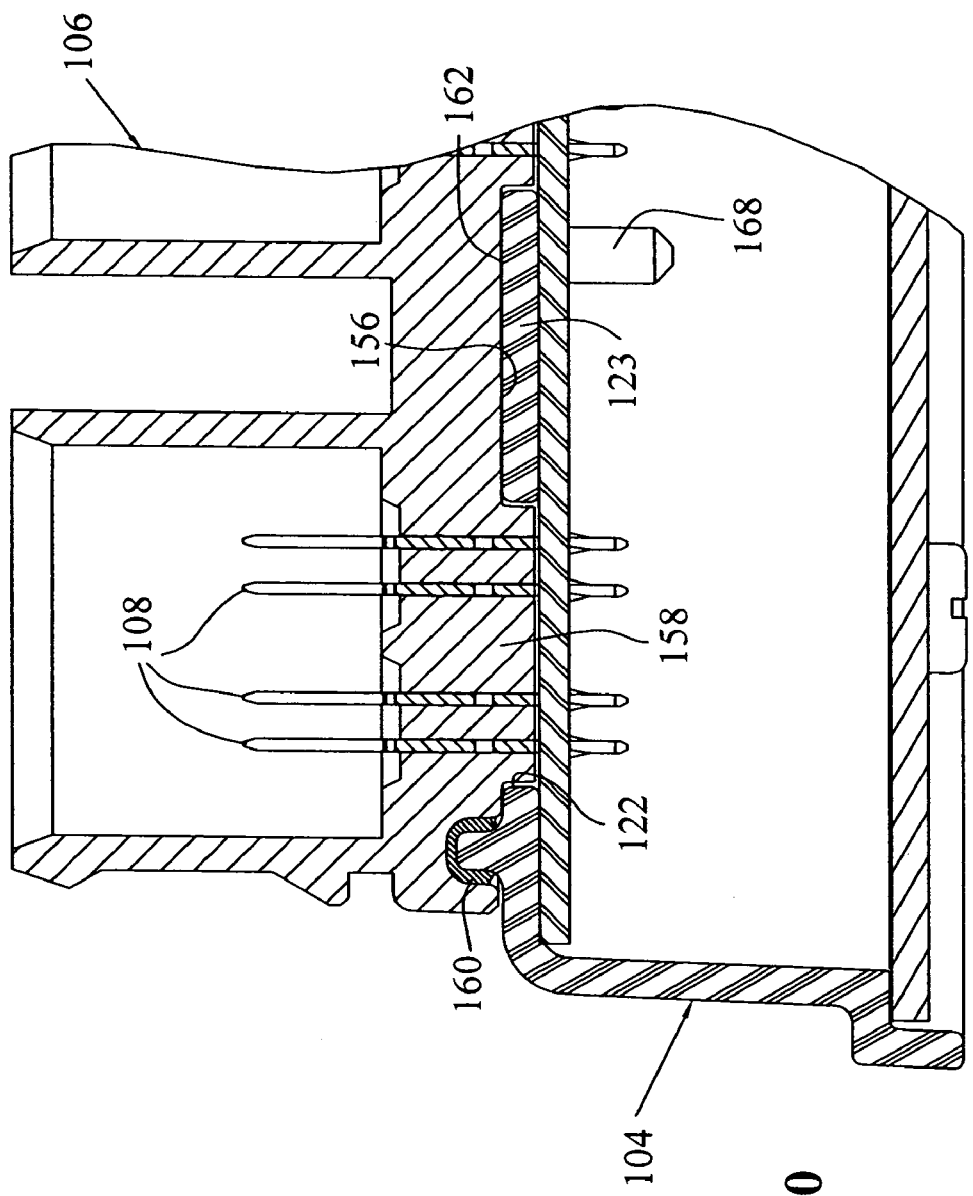
FIG. 20 is a cross-sectional view through lines 20-20 of FIG. 13.

With respect now to FIG. 19, header 106 is shown poised for receipt against casing 104 and into electrical connection with printed circuit board 110, whereas FIG. 20 shows the components in the assembled view. As shown best in FIG. 20, raised portions 158 are shown positioned within openings 122 with strap portion 123 being positioned against lower surface 156. Once again a pressure sensitive adhesive material 162 can be positioned intermediate lower surface 156 and casing 104 to adhesively fix header 106 to casing 104. This adhesive 162 can be to the periphery of the casing alone, to the periphery of the casing and the strap portion 123, and/or to just the strap portion.

As an alternative to providing the pressure sensitive adhesive, an adhesive tape could be provided where the tape is used to both bond and seal the interconnection between the connector header and printed circuit board.

In either event, the above-described invention provides numerous advantages over prior art electronic modules. Firstly, the device allows for a simplified, one-step assembly of the casing 4, 104, header 6, 106 and printed circuit board 10, 110 to each other. Moreover, this is a one-motion force fitting of the three devices, that is, a single linear motion along the axis of the pin terminals. This allows for a quick and simplified method of the assembly process. Furthermore, this allows for fully automated assembly of the three components. Moreover, fasteners are not required to connect to the printed circuit board, which requires valuable printed circuit board real estate requiring a larger module. Finally, the module is designed with a header such that it will face the device to be connected, for example, to an engine, whereby the opening to the casing 4, 104 is on the opposite side of the module casing itself, thereby providing a heat shield to the electronic components and printed circuit board therein.

The invention claimed is:

1. An electronic module, comprising:
   a casing defining a cavity therein, said casing having at least one opening therethrough for communication with said cavity;
   a substrate received in said cavity, said substrate having a plurality of throughholes positioned adjacent to and overlapping with said opening;
   a connector header positioned over said casing opening, said connector having a plurality of electrical terminals, with first portions positioned exterior of said cavity, and second portions extending into said cavity and into said throughholes of said substrate forming an electrical and mechanical connection therewith; and
   wherein said mechanical connection at least partially retains said connector header and substrate to said casing.

2. The electronic module of claim 1, wherein said casing is defined by a planar wall and upstanding peripheral walls, said opening extending through said planar wall, and said peripheral walls forming said cavity.

3. The electronic module of claim 2, wherein said terminal second portions are compliant pin sections.

4. The electronic module of claim 3, wherein said substrate is a printed circuit board, and said throughholes are plated and interconnected to traces on said circuit board.

5. The electronic module of claim 4, further comprising electronic components positioned within said cavity and mounted to said printed circuit board, interconnected to said traces.

6. The electronic module of claim 1, wherein said casing further comprises an upstanding sealing wall in a surrounding relation to said opening.

7. The electronic module of claim 6, wherein said connector header has a sealing groove with a complementary geometry as said upstanding sealing wall and is received therein.

8. The electronic module of claim 7, further comprising a seal member positioned within said sealing groove and in sealing contact with said sealing wall.

9. The electronic module of claim 1, wherein said connector header has a mounting surface which extends at least partially into said opening.

10. The electronic module of claim 9, wherein said header mounting surface is adhesively fixed to said substrate.

11. The electronic module of claim 9, wherein said header mounting surface is adhesively fixed to said casing.

12. The electronic module of claim 11, wherein said casing has two elongate openings, with an intermediate strap portion, said connector header having raised portions adjacent said compliant pin portions, received in said openings, and a mounting portion intermediate said raised portions.

13. The electronic module of claim 12, wherein said mounting surface is adhesively fixed to said strap portion.

14. A method of making an electronic module, comprising the steps of:
   providing a casing defining a cavity therein, said casing having an opening therethrough for communication with said cavity;
   positioning a substrate in said cavity, said substrate having a plurality of throughholes positioned adjacent to and overlapping with said opening;
   positioning a connector header over said casing opening in a mating direction, said connector having a plurality of electrical terminals, with first portions positioned exterior of said cavity, and second portions extending into said cavity and into said throughholes of said substrate forming an electrical and mechanical connection therewith;
   providing a sealing member between said casing and said header which is compressed in the mating direction, and retaining said connector header against said casing.

15. The method of claim 14, wherein a mechanical connection between said header and said substrate retains said connector header and substrate to said casing.

16. The method of 15, wherein said terminal second portions are provided as compliant pin sections.

17. The method of claim 14, wherein said casing is provided with an upstanding sealing wall in a surrounding relation to said opening.

18. The method of claim 17, wherein said connector header is provided with a sealing groove with a complementary geometry as said upstanding sealing wall and is received therein.

19. The method of claim 18, wherein said seal member is positioned within said sealing groove and in sealing contact with said sealing wall.

20. The method of claim 14, wherein said connector header is provided with a mounting surface which extends at least partially into said opening and is placed in contact with said substrate.

21. The method of claim 20, wherein said header mounting surface is adhesively fixed to said substrate.

22. The method of claim 20, wherein said header mounting surface is adhesively fixed to said casing.

23. The method of claim 22, wherein said casing is provided with two elongate openings, with an intermediate strap portion, said connector header having raised portions adjacent said compliant pin portions received in said openings and a mounting portion intermediate said raised portions.

24. The method of claim 23, wherein said mounting surface is adhesively fixed to said strap portion.

25. The method of claim 14, wherein said connector header, casing and substrate are attached to each other simultaneously.

26. The method of claim 25, wherein said connector header, casing and substrate are attached to each other by a single movement towards each other along said mating axis.

* * * * *